(12) United States Patent
Jeppson

(10) Patent No.: US 11,889,772 B2
(45) Date of Patent: *Jan. 30, 2024

(54) METHODS FOR FORMING MEMORY DEVICES, AND ASSOCIATED DEVICES AND SYSTEMS

(71) Applicant: Micron Technology, Inc., Boise, ID (US)

(72) Inventor: Michael B. Jeppson, Lehi, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/833,477

(22) Filed: Jun. 6, 2022

(65) Prior Publication Data

US 2022/0302387 A1 Sep. 22, 2022

Related U.S. Application Data

(63) Continuation of application No. 16/914,887, filed on Jun. 29, 2020, now Pat. No. 11,398,599.

(51) Int. Cl.
*H10N 70/00* (2023.01)
*H10B 63/00* (2023.01)
*H10N 70/20* (2023.01)

(52) U.S. Cl.
CPC ........... *H10N 70/063* (2023.02); *H10B 63/24* (2023.02); *H10B 63/80* (2023.02); *H10N 70/231* (2023.02); *H10N 70/882* (2023.02)

(58) Field of Classification Search
CPC .................................................. H10N 70/063
See application file for complete search history.

(56) References Cited

U.S. PATENT DOCUMENTS

| | | |
|---|---|---|
| 2010/0038699 A1 | 2/2010 | Katsumata et al. |
| 2014/0353662 A1 | 12/2014 | Shukh |
| 2019/0287992 A1 | 9/2019 | Sato |
| 2019/0326314 A1 | 10/2019 | Xiao et al. |
| 2020/0395408 A1* | 12/2020 | Takahashi ............ H10B 63/845 |
| 2021/0126008 A1 | 4/2021 | Tanabe et al. |
| 2021/0202299 A1 | 7/2021 | Zheng et al. |
| 2021/0408377 A1 | 12/2021 | Jeppson |

FOREIGN PATENT DOCUMENTS

| | | |
|---|---|---|
| TW | 201011900 A | 3/2010 |
| TW | 201434138 A | 9/2014 |
| TW | 201944542 A | 11/2019 |

OTHER PUBLICATIONS

TW Patent Application No. 110122053—Taiwanese Office Action and Search Report, dated Mar. 3, 2022, with English Translation, 12 pages.

* cited by examiner

*Primary Examiner* — Mounir S Amer
(74) *Attorney, Agent, or Firm* — Perkins Coie LLP

(57) ABSTRACT

Methods of manufacturing memory devices, and associated systems and devices, are disclosed herein. In one embodiment, a method of manufacturing a memory device includes (a) removing a portion of an insulative material to define a recess, (b) forming a memory stack in the recess, and (c) etching the memory stack to define a plurality of memory elements. In some embodiments, the method can further include forming conductive vias in a remaining portion of the insulative material, and forming a metallization structure electrically coupling the conductive vias to corresponding ones of the memory elements.

19 Claims, 8 Drawing Sheets

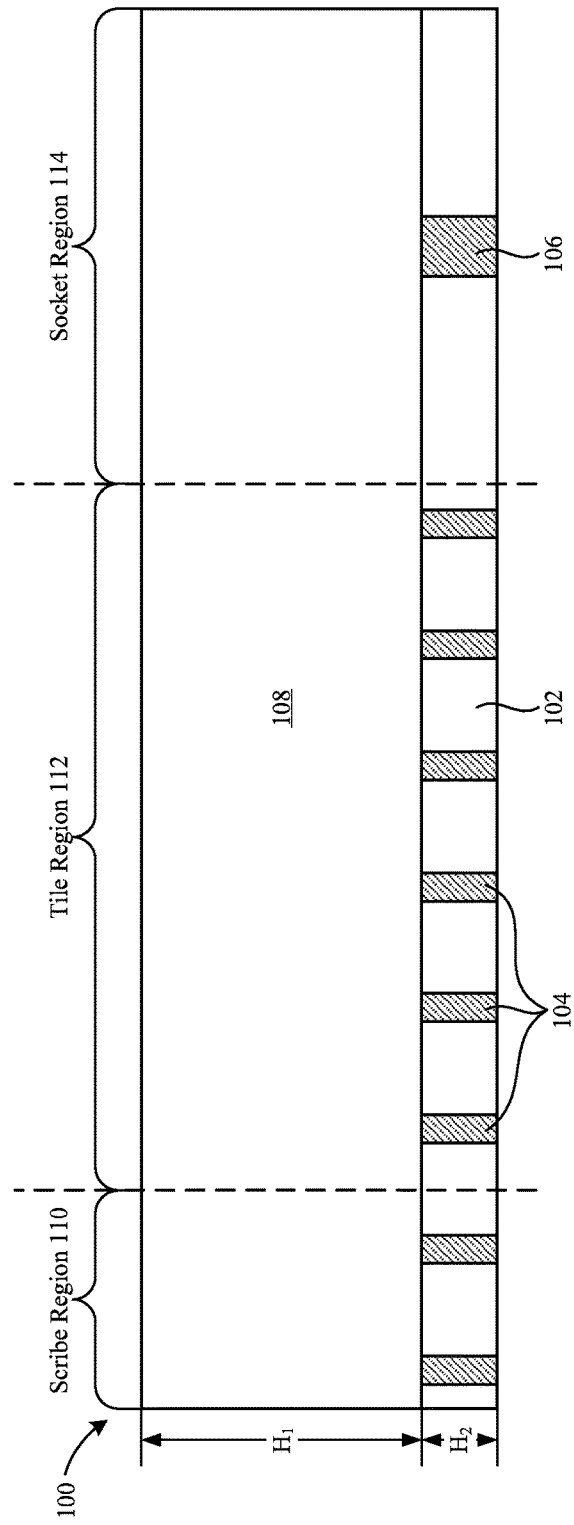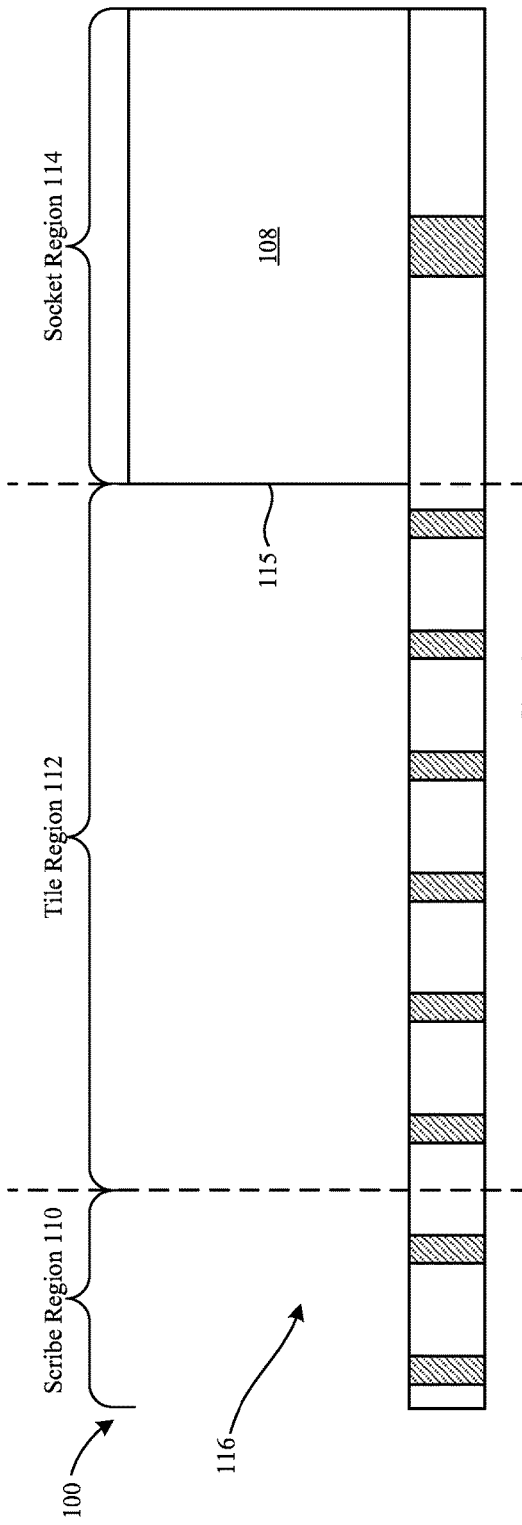

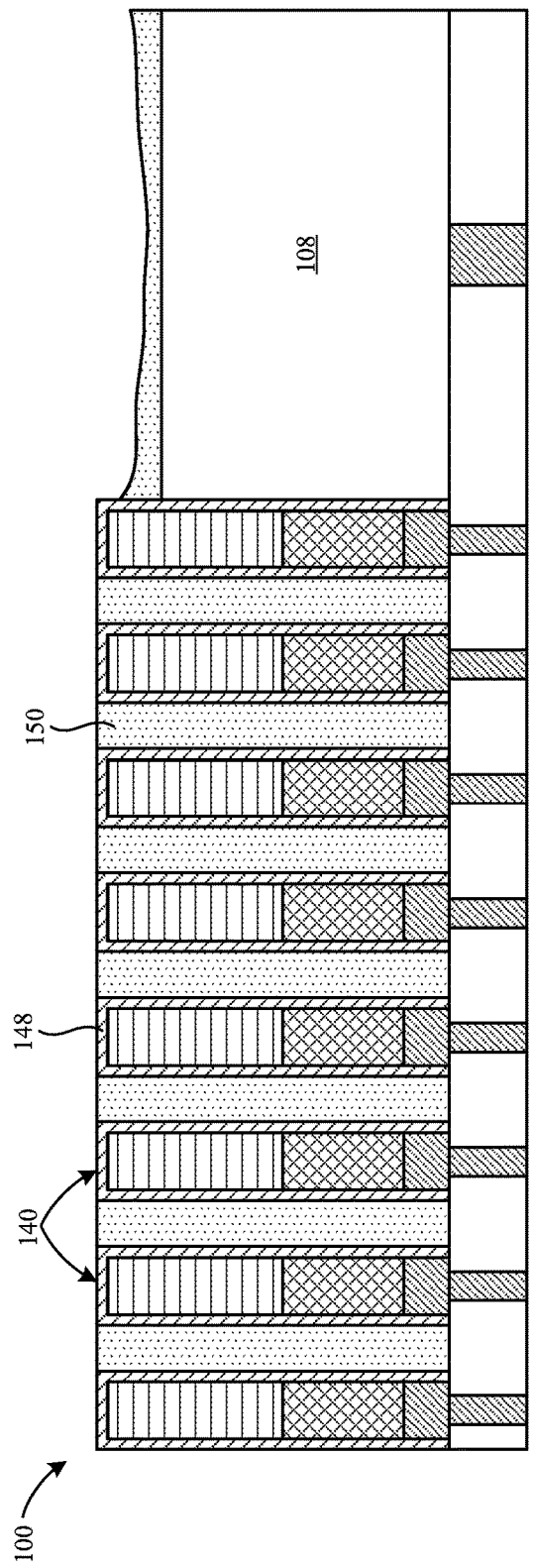
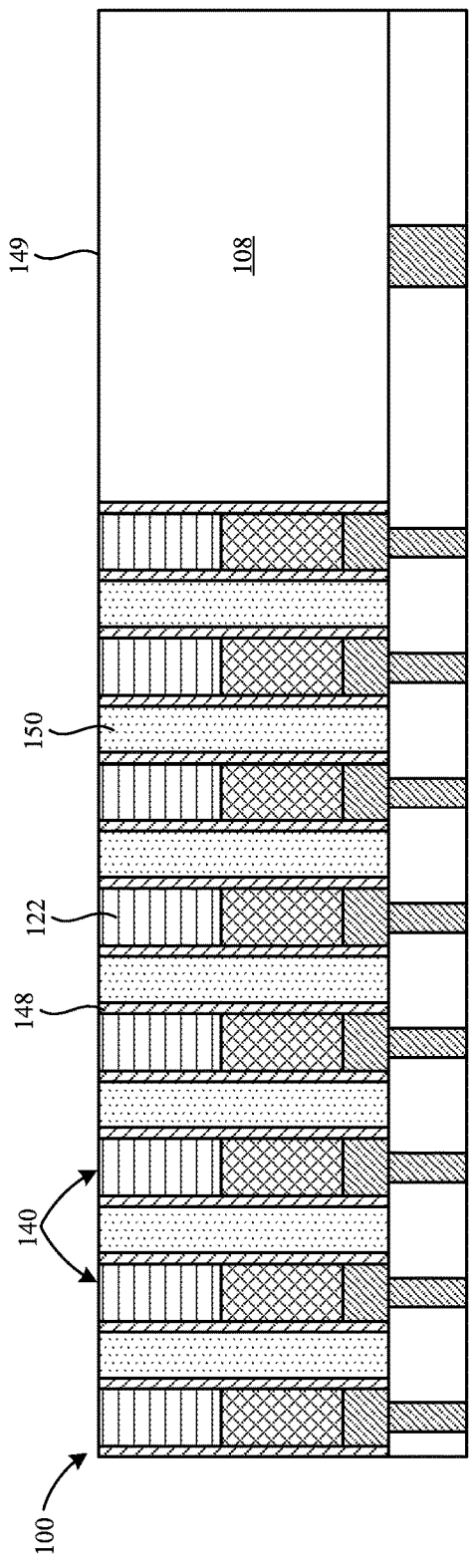
FIG. 1G
FIG. 1H

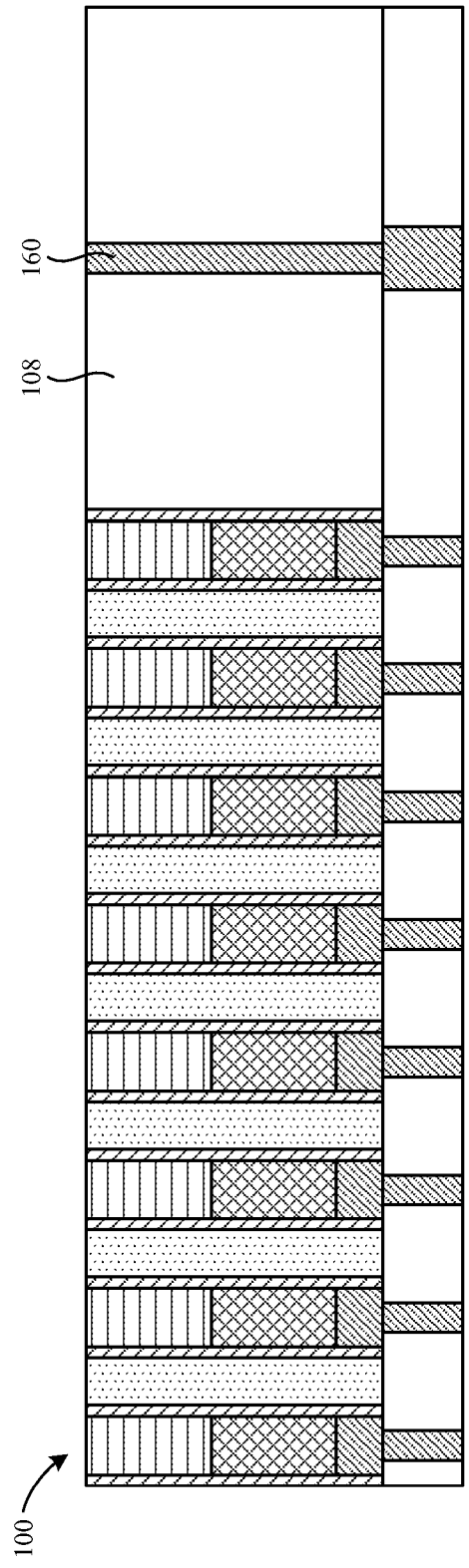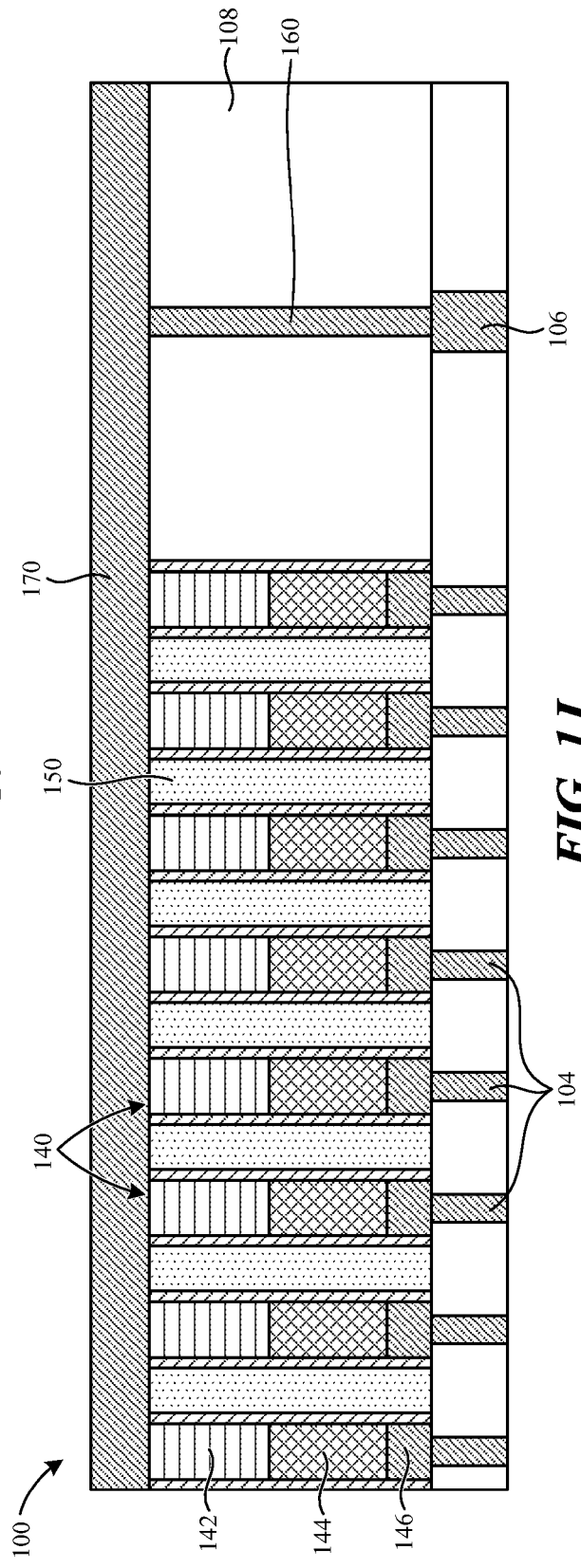

METHODS FOR FORMING MEMORY DEVICES, AND ASSOCIATED DEVICES AND SYSTEMS

CROSS-REFERENCE TO RELATED APPLICATION

This application is a continuation of U.S. patent application Ser. No. 16/914,887, filed Jun. 29, 2020, and titled "METHODS FOR FORMING MEMORY DEVICES, AND ASSOCIATED DEVICES AND SYSTEMS," which is incorporated herein by reference in its entirety.

TECHNICAL FIELD

The present technology generally relates to memory devices and methods for manufacturing memory devices, and more particularly relates to methods including forming an oxide in a socket region of a memory device before forming memory elements of the memory device.

BACKGROUND

Memory devices are widely used to store information related to various electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance of manufacturing steps (e.g., removal or deposition of materials), improve the scale of manufacturing, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIGS. 1A-1J are enlarged side cross-sectional views illustrating various stages in a method of manufacturing a memory device in accordance with embodiments of the present technology.

DETAILED DESCRIPTION

Figure 1C:
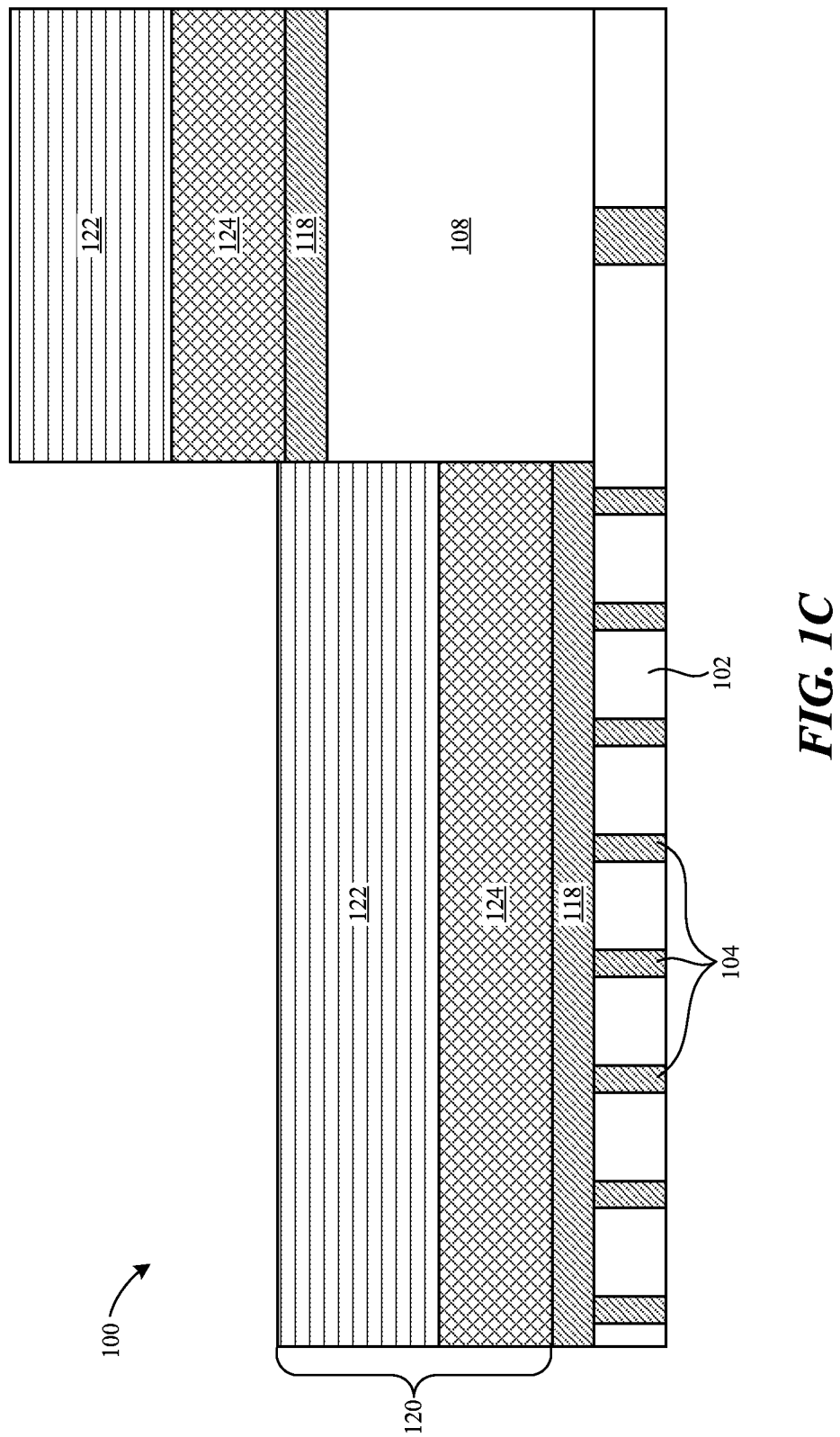

Embodiments of the present technology include methods of manufacturing memory devices, and associated devices and systems. In several of the embodiments described below, for example, a method of manufacturing a memory device includes (i) removing a portion of an insulative material to define a recess, (ii) forming a memory stack in the recess, and (iii) etching the memory stack to define a plurality of memory elements. In some embodiments, the method can further include forming a plurality of conductive vias in the remaining (e.g., non-etched) insulative material, and forming a metallization layer to electrically couple the conductive vias to corresponding ones of the memory elements. Accordingly, the insulative material and the conductive vias can form a "socket" having electrical connections for the memory elements.

In one aspect of the present technology, the memory stack is deposited directly into the recess in the insulative material, and the insulative material is used to form the socket. In contrast, some known methods of manufacturing memory devices include etching a plurality of memory elements to form a recess, and then filling the recess with an insulative material to form a socket. Accordingly, the methods of the present technology do not require etching of the memory elements to form a socket. This method flow advantageously avoids exposing a portion of the memory elements that would otherwise be exposed during the etching step used to form the socket of insulating material. This can help inhibit or even prevent contamination (e.g., oxidation) of the memory elements. In another aspect of the present technology, the method flow is simplified as stages related to protecting and etching the memory elements can be omitted.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-2. For example, some details of memory devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-2.

FIGS. 1A-1J are enlarged side cross-sectional views illustrating various stages in a method of manufacturing a memory device 100 (e.g., a semiconductor device) in accordance with embodiments of the present technology. Generally, the memory device 100 can be manufactured, for example, as a discrete device or as part of a larger wafer or panel. In wafer-level or panel-level manufacturing, a larger structure is formed before being singulated to form a plurality of individual structures. For ease of explanation and understanding, FIGS. 1A-1J illustrate the fabrication of a portion of a single memory device 100. However, one skilled in the art will readily understand that the fabrication of the memory device 100 can be scaled to the wafer and/or panel level—that is, to include many more components so as to be capable of being singulated into two or more memory devices—while including similar features and using similar processes as described herein.

FIG. 1A illustrates the memory device 100 after formation of a (i) first insulative layer 102, (ii) first conductive vias 104 extending through the first insulative layer 102, (iii) second conductive vias 106 extending through the first insulative layer 102, and (iv) a second insulative layer 108 over the first insulative layer 102. The first and second insulative layers 102, 108 can include one or more insulative materials such as a passivation material, dielectric material, oxide (e.g., silicon oxide), tetraethyl orthosilicate (TEOS), etc., and the insulative material in the first and second insulative layers 102, 108 can be the same or different. In a particular embodiment, the first and second insulative layers 102, 108 both comprise an oxide material. The first and second conductive vias 104, 106 can comprise a metal such as tungsten, a metal alloy, a conductive-metal containing material, etc., and can have the same or varying dimensions (e.g., widths, diameters, etc.) and/or cross-sectional shapes (e.g., circular, polygonal, rectilinear, irregular, etc.).

In some embodiments, the memory device 100 includes a scribe region 110, a tile region 112, and a socket region 114. As described in greater detail below, a plurality (e.g., an array) of memory elements can be formed in the scribe and tile regions 110, 112, and electrical connections for the memory elements can be formed in the socket region 114. The scribe region 110 can be a sacrificial region used to (e.g., destructively) test the memory elements formed in the tile region 112. In the illustrated embodiment, the first conductive vias 104 can be formed to extend through the first insulative layer 102 in the scribe and tile regions 110, 112, and the second conductive vias 106 can be formed to extend through the first insulative layer 102 in the socket region 114.

In some embodiments, the second insulative layer 108 can have a thickness or height $H_1$ that is selected to correspond to a final height of the memory elements (e.g., as shown in FIG. 1H). The height $H_1$ can also be selected/tuned based on time to planarity needs from potential dishing effects from etching, polishing, and/or other downstream processing steps on the memory device 100. In some embodiments, the first insulative layer 102 can have a thickness or height $H_2$ that can be the same or different as the height $H_1$ of the second insulative layer 108.

FIG. 1B illustrates the memory device 100 after removing the second insulative layer 108 from the scribe and tile regions 110, 112 to form a recess 116. A photolithography, etching, masking, and/or other suitable process can be used to remove the portion of the second insulative layer 108 over the scribe and tile regions 110, 112. In the illustrated embodiment, the remaining portion of the second insulative layer 108 in the socket region 114 includes a generally vertical sidewall 115 at the transition between the tile region 112 and the socket region 114.

FIG. 1C illustrates the memory device 100 after forming/depositing (i) a first metallization layer 118 over the first and second insulative layers 102, 108 and (ii) a memory stack 120 over the first metallization layer 118. The first metallization layer 118 can comprise a metal such as tungsten, copper, silver, aluminum, a metal alloy, a conductive-metal containing material, etc., and can electrically couple the first conductive vias 104 to the memory stack 120. In the illustrated embodiment, the memory stack 120 includes a memory cell layer 122 and a selector layer 124 that can comprise, for example, one more chalcogenide materials. In some embodiments, the memory cell layer 122 and/or the selector layer 124 can include two or more layers of different materials. In some embodiments, the memory stack 120 can omit the memory cell layer 122, can omit the selector layer 124, and/or can include various other structures used in memory devices (e.g., other memory materials arranged so as to provide another memory structure and/or associated function). The first metallization layer 118 and the memory stack 120 can be formed via sputtering, chemical vapor deposition, physical vapor deposition, atomic layer deposition, spin coating, electroplating, electro-less plating, and/or another suitable deposition technique.

Referring to FIGS. 1B and 1C together, the first metallization layer 118 and the memory stack 120 can be formed in (i) the recess 116 in/over the scribe and tile regions 110, 112 and (ii) on the second insulative layer 108 in the socket region 114. As described in detail below with reference to FIGS. 1D-1J, the memory stack 120 can be patterned in the scribe and tile regions 110, 112 to form individual memory elements, while the memory stack 120 in the socket region 114 can be removed to provide space for electrical connections to be formed for the individual memory elements. Accordingly, in some embodiments the first metallization layer 118 and the memory stack 120 need not be formed over the second insulative layer 108 in the socket region 114.

Figure 1D:
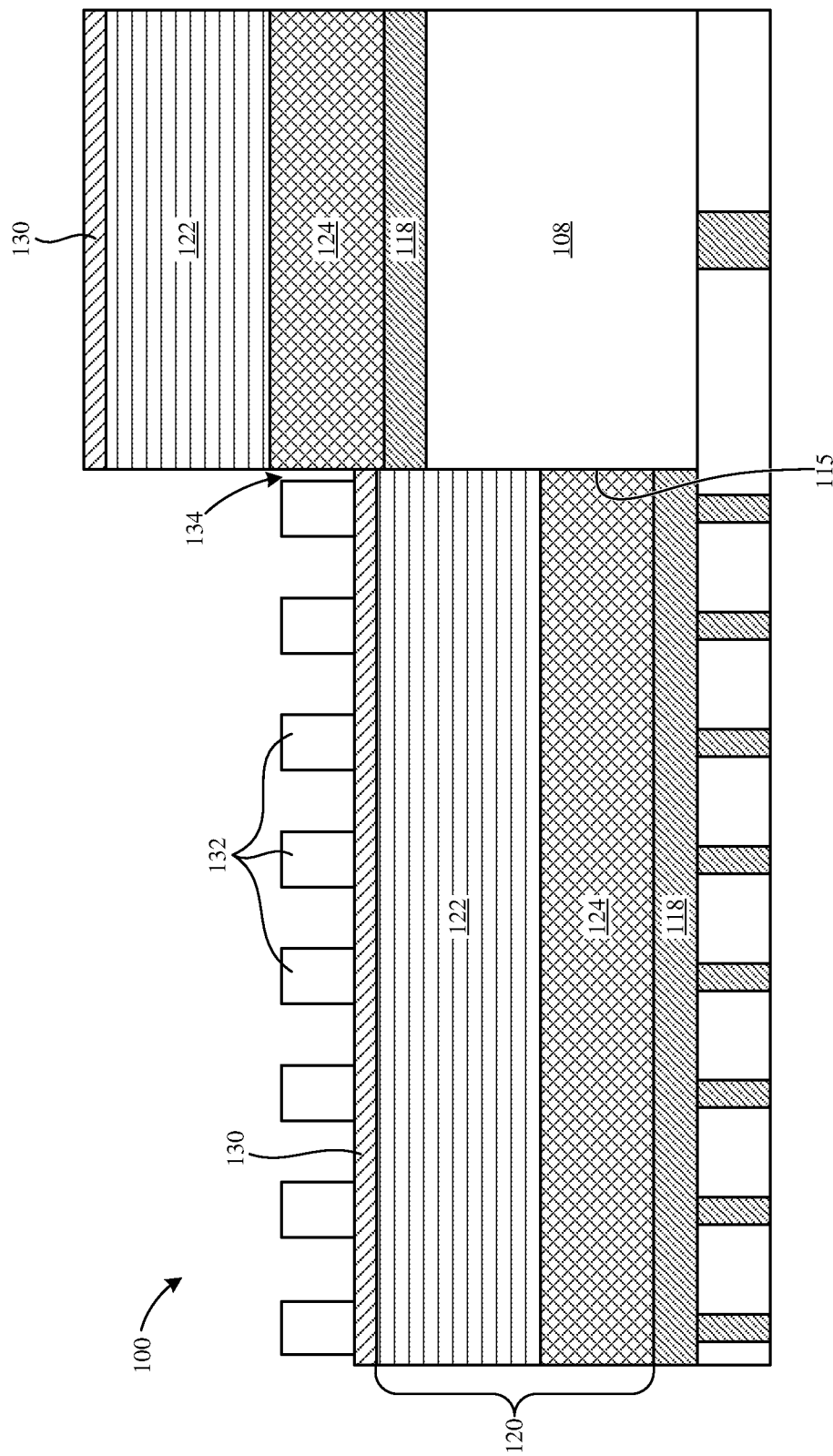

FIG. 1D illustrates the memory device 100 after forming (i) a protection layer 130 over the memory stack 120 (e.g., on an upper surface of the memory cell layer 122) and (ii) a mask 132 over the protection layer 130 in the scribe and tile regions 110, 112 (FIGS. 1A and 1B). In some embodiments, the protection layer is a hardmask, such as a nitride hardmask (e.g., comprising silicon nitride (SiN)). The mask 132 can be a photomask or other mask (e.g., comprising an oxide) for inhibiting removal of portions of the memory stack 120 below the mask 132 during downstream material removal stages. In the illustrated embodiment, the mask 132 can define an opening or open region 134 (e.g., can be spaced apart from the sidewall 115 of the second insulative layer 108). In some embodiments, one or more sacrificial layers (e.g., carbon layers, nitride layers, etc.; not shown) can be deposited over the memory stack 120 in addition to the protection layer 130.

Figure 1E:
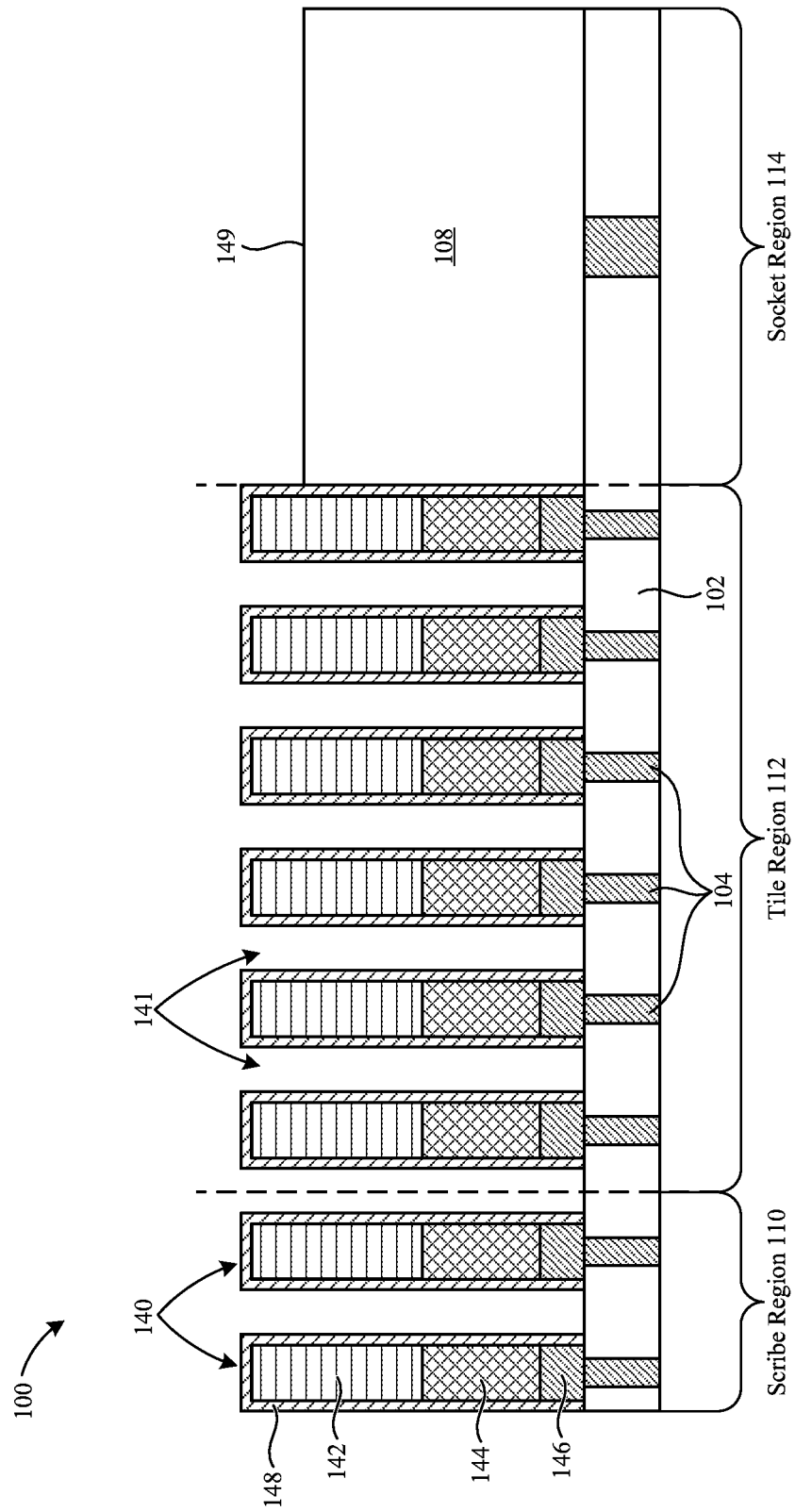

FIG. 1E illustrates the memory device 100 after etching the memory device 100 to (i) form/define individual memory elements 140 in the scribe and tile regions 110, 112 and (ii) remove the memory stack 120 and the first metallization layer 118 from the second insulative layer 108 in the socket region 114. More specifically, with reference to FIGS. 1D and 1E together, a photolithography, plasma etching, wet etching, and/or other suitable process can be used to remove the portions of the first metallization layer 118 and memory stack 120 exposed from the mask 132. In the illustrated embodiment, after etching, the memory elements 140 are arranged in columns separated by openings 141. Moreover, each of the memory elements 140 includes a memory cell 142 formed from a portion of the memory cell layer 122, and a selector 144 formed from a portion of the selector layer 124. The memory cells 142 are operably (e.g., electrically) coupled to the selectors 144 and to corresponding ones of the first conductive vias 104 via corresponding conductive lines 146 (e.g., word lines) formed from a portion of the first metallization layer 118. In the illustrated embodiment, the memory elements 140 extend away from the first insulative layer 102 to an elevation that is greater than an elevation of the second insulative layer 108 (e.g., to an elevation above an upper surface 149 of the second insulative layer 108). In other embodiments, the memory elements 140 can extend to the same elevation or a lower elevation as the second insulative layer 108.

FIG. 1E further illustrates the memory device 100 after forming a liner layer 148 (e.g., a sealing layer, protection layer, etc.) around each of the memory elements 140. The liner layer 148 can be formed around all or a portion (e.g., a top portion, a sidewall portion, etc.) of the memory elements 140. The liner layer 148 can comprise an insulating material such as silicon nitride, an oxide, etc., and is configured to protect the memory elements 140 from contamination, damage, etc., during downstream manufacturing stages and/or during operation of the memory device 100. In some embodiments, a portion of the liner layer 148 is formed from the protection layer 130 deposited at the stage shown in FIG. 1D.

Figure 1F:
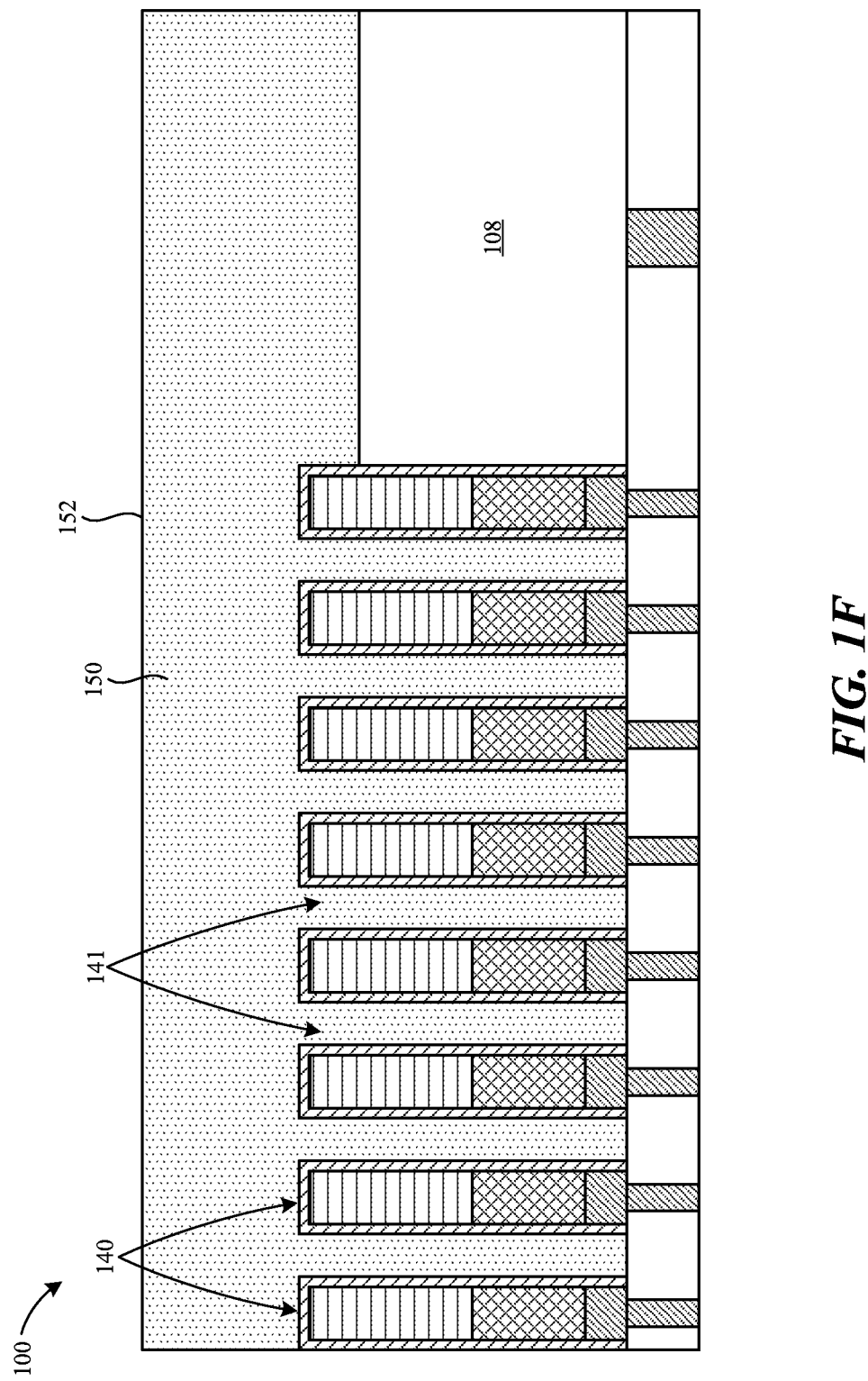

FIG. 1F illustrates the memory device 100 after depositing an insulating material 150 over the memory elements 140 and the second insulative layer 108. In the illustrated embodiment, the insulating material 150 fills the openings 141 between the memory elements 140 and includes an upper surface 152. In some embodiments, the insulating material 150 can be a dielectric material or film that is applied via a spin-on process such that, for example, the upper surface 152 is generally planar despite the varying topography (e.g., varying heights, thicknesses, etc.) of the memory elements 140, the openings 141, and the second insulative layer 108.

FIG. 1G illustrates the memory device 100 after removing a portion of the insulating material 150 over the memory elements 140 and the second insulative layer 108. In some embodiments, the insulating material 150 can be planarized/polished to remove the insulating material 150 using plasma etching, wet etching, chemical-mechanical planarization (CMP), buffing, and/or other suitable techniques. In a particular embodiment, the insulating material 150 is removed by planarizing the upper surface 152 (FIG. 1F) of the insulating material 150 using a CMP process that stops on the liner layer 148 (e.g., nitride layer) of the memory elements 140. In some embodiments, a portion of the insulating material 150 can remain on the second insulative layer 108 as shown in FIG. 1G.

FIG. 1H illustrates the memory device 100 after further planarizing/polishing the memory device 100 to remove a portion of the liner layers 148 of the memory elements 140 to expose the memory cells 142. In some embodiments, after planarization, the memory elements 140 extend to an elevation that is the same as or about the same as the elevation of the upper surface 149 of the second insulative layer 108. Accordingly, the memory device 100 can have a generally planar upper surface after planarization. The memory device 100 can be planarized/polished using plasma etching, wet etching, chemical-mechanical planarization (CMP), buffing, and/or other suitable techniques.

FIG. 1I illustrates the memory device 100 after formation of third conductive vias 160 through the second insulative layer 108. Only one of the third conductive vias 160 is shown in FIG. 1I for the sake of illustration. In some embodiments, the third conductive vias 160 are formed by a suitable masking, etching, and deposition process. For example, a photolithography and/or etching process can be used to etch high-aspect ratio holes through the second insulative layer 108, and then conductive material can be deposited into the holes to form the third conductive vias 160 using chemical vapor deposition, physical vapor deposition, atomic layer deposition, spin coating, electroplating, electro-less plating, and/or another suitable technique.

FIG. 1J illustrates the memory device 100 after formation/deposition of a second metallization layer 170 over the memory elements 140, the insulating material 150, the second insulative layer 108, and the third conductive vias 160. The second metallization layer 170 can comprise a metal such as tungsten, a metal alloy, a conductive-metal containing material, etc., and can be formed via sputtering, chemical vapor deposition, physical vapor deposition, atomic layer deposition, spin coating, electroplating, electro-less plating, and/or another suitable deposition technique. The second metallization layer 170 electrically couples the memory elements 140 to corresponding ones of the third conductive vias 160. Accordingly, the memory elements 140 are electrically accessible via the first and second conductive vias 104, 106. In some embodiments, the second metallization layer 170 can be patterned to, for example, form conductive lines (e.g., bit lines) that are electrically coupled to a portion/subset of the memory elements 140. In some embodiments, the second metallization layer 170 includes conductive lines that extend generally perpendicular to the conductive lines 146 of the first metallization layer 118.

In some embodiments, the formation of the third conductive vias 160 (FIG. 1I) and the formation of the second metallization layer 170 (FIG. 1J) can be combined into a single step. For example, the metal used to form the second metallization layer 170 can be deposited over the memory elements 140, the insulating material 150, the second insulative layer 108, and the third conductive vias 160 at the same time as the metal is deposited into the holes used to form the third conductive vias 160.

In operation, each of the memory cells 142 can store a bit of data and can be written to (e.g., accessed) by varying a voltage supplied to the corresponding one of the selectors 144 via the conductive lines 146 (e.g., the first metallization layer 118) and/or the second metallization layer 170. More specifically, applying the voltage to the selectors 144 can cause/initiate a bulk property change in the material of the corresponding memory cells 142, which modifies the resistance level of the memory cells 104. The memory cells 104 can have either a high-resistance state or a low-resistance state that can be read as a 1 or a 0. In some embodiments, the memory cells 142 are non-volatile. The first and second conductive vias 104, 106 can be used to operably couple the memory device 100 to external devices (e.g., a processor device) and/or to other components (e.g., other memory devices) within an integrated memory package. As one of ordinary skill in the art will appreciate, the memory device 100 can be further "packaged" for protection and to include appropriate electrical interconnections.

The manufacture of some memory devices includes forming an array of memory elements before removing a portion of the memory elements to form a socket including electrical connections for the memory elements. For example, U.S. patent application Ser. No. 16/780,594, filed Feb. 3, 2020, and titled "METHODS FOR FORMING MEMORY DEVICES, AND ASSOCIATED DEVICES AND SYSTEMS," describes such methods, and is incorporated herein by reference in its entirety. Referring to FIGS. 1A-1J together, in one aspect of the present technology the second insulative layer 108 is formed before the memory elements 140. Accordingly, the memory stack 120 is deposited directly into the recess 116 in the second insulative layer 108, and the memory stack 120 does not need to be etched/removed to form a socket for the second insulative layer 108 and the third conductive vias 160. This method flow avoids exposing a portion of the memory elements 140 (e.g., a row of the memory elements 140 adjacent the sidewall 115 of the second insulative layer 108) during an etching step to form the socket of insulating material. This can help inhibit or even prevent contamination (e.g., oxidation) of the memory elements 140. In another aspect of the present technology, the flow is simplified as there is no need to etch a portion of the memory elements 140 and to subsequently deposit the second insulative layer 108 in the socket region 114. For example, steps to protect the memory elements 140 in the scribe and tile regions 110, 112 during etching can be omitted and replaced with a simple masking/etching step to form the recess 116 in the second insulative layer 108 (FIG. 1B).

In some embodiments, the memory device 100 can include one or more additional layers of memory elements above the memory elements 140, thereby forming a three-dimensional (3D) memory array. In some embodiments, the one or more additional layers can be formed in a generally similar or identical manner to the single layer illustrated in FIGS. 1A-1J. For example, (i) first and second insulative layers can be formed on/above the second metallization layer 170 and conductive vias can be formed through the first insulative layer (e.g., as in FIG. 1A), (ii) the second insulative layer can be recessed (e.g., as in FIG. 1B), (iii) a memory stack can be deposited in the recess (e.g., as in FIG. 1C), and so on. In some embodiments, the tile regions 112 and/or the socket regions 114 for each subsequent layer of memory elements can be at least partially offset (e.g., laterally offset) from one another to provide space for the conductive vias.

Figure 2:
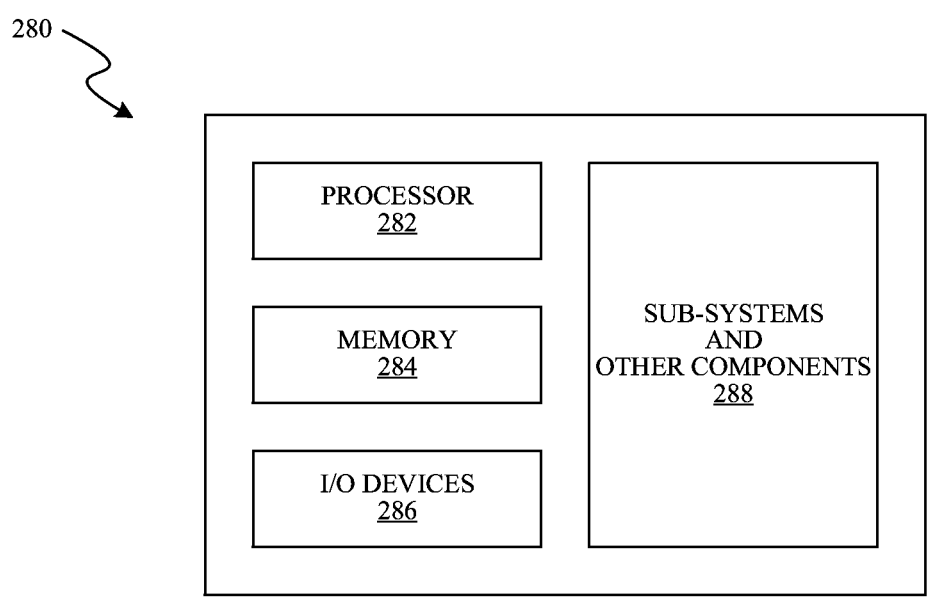
FIG. 2 is a schematic view of a system that includes a memory device in accordance with embodiments of the present technology.

The memory device 100 described in detail above with reference to FIGS. 1A-1J and/or packages incorporating the memory device 100 can be incorporated into any of a myriad of larger and/or more complex systems, a representative example of which is system 280 shown schematically in FIG. 2. The system 280 can include a processor 282, a memory 284 (e.g., SRAM, DRAM, flash, and/or other memory devices), input/output devices 286, and/or other subsystems or components 288. The memory devices and/or packages described above with reference to FIGS. 1A-1J can be included in any of the elements shown in FIG. 2. The resulting system 280 can be configured to perform any of a wide variety of suitable computing, processing, storage, sensing, imaging, and/or other functions. Accordingly, representative examples of the system 280 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 280 include lights, cameras, vehicles, etc. With regard to these and other example, the system 280 can be housed in a single unit or distributed over multiple interconnected units, for example, through a communication network. The components of the system 280 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A method of manufacturing a memory device, the method comprising:
    forming a memory stack in a recess of an insulative material by—
        forming a metallization layer in the recess;
        depositing a selector layer in the recess over the metallization layer;
        depositing a memory cell layer over the selector layer; and
        etching the memory stack to define a plurality of memory elements.

2. The method of claim 1 wherein etching the memory stack to define the memory elements includes etching the metallization layer to form a plurality of conductive lines electrically coupled to corresponding ones of the memory elements.

3. The method of claim 1 wherein the method further comprises forming conductive vias through the insulative material.

4. The method of claim 3 wherein the metallization layer is a first metallization layer, and wherein the method further comprises forming a second metallization layer over the memory elements and the conductive vias such that the second metallization layer electrically couples the conductive vias to corresponding ones of the memory elements.

5. The method of claim 1 wherein the insulative material is an oxide material.

6. The method of claim 1 wherein at least one of the selector layer and the memory cell layer include a chalcogenide material.

7. The method of claim 1 wherein the insulative material has an upper surface, and wherein forming the memory stack in the recess includes forming the memory stack to have an elevation greater than an elevation of the upper surface of the insulative material.

8. The method of claim 1 wherein the method further comprises forming a protective liner around individual ones of the memory elements.

9. A method of manufacturing a memory device, the method comprising:

forming a memory stack in a recess in an insulative material such that the memory stack has an elevation greater than an elevation of an upper surface of the insulative material;

etching the memory stack to define a plurality of memory elements; and planarizing the memory elements to have a same elevation as the elevation of the upper surface of the insulative material.

10. The method of claim 9 wherein at least one of the selector layer and the memory cell layer include a chalcogenide material.

11. The method of claim 9 wherein the method further comprises:

depositing a dielectric material over the memory elements and the upper surface of insulative layer; and after depositing the dielectric material, planarizing the dielectric material to remove the dielectric material over the upper surface of the insulative layer.

12. The method of claim 9 wherein the method further comprises:

forming conductive vias through the insulative material; and forming a metallization layer over the memory elements and the conductive vias, wherein the metallization layer electrically couples the conductive vias to corresponding ones of the memory elements.

13. A method of manufacturing a memory device, the method comprising:

forming a plurality of memory elements in a recess of a tile region of a second insulative layer, wherein the second insulative layer is positioned over a first insulative layer;

forming a plurality of first conductive vias in a socket region of the second insulative layer;

forming a plurality of second conductive vias in the first insulative layer;

forming a first metallization layer electrically coupling the first conductive vias to corresponding ones of the memory elements; and forming a second metallization layer electrically coupling the second conductive vias to corresponding ones of the memory elements.

14. The method of claim 13 wherein individual ones of the memory elements include a selector operably coupled to a memory cell, wherein the first metallization layer electrically couples the first conductive vias to corresponding ones of the memory cells, and wherein the second metallization layer electrically couples the second conductive vias to corresponding ones of the selectors.

15. The method of claim 13 wherein the memory elements include a chalcogenide material.

16. A method of manufacturing a memory device, the method comprising:

forming a plurality of memory elements in a recess of a tile region of a second insulative layer, wherein the second insulative layer is positioned over a first insulative layer, and wherein forming the memory elements in the recess includes— depositing a selector layer in the recess;

depositing a memory cell layer over the selector layer; and etching the selector layer and the memory cell layer to form the memory elements; and forming a plurality of conductive vias in a socket region of the second insulative layer.

17. The method of claim 16 wherein at least one of the selector layer and the memory cell layer include a chalcogenide material.

18. A method of manufacturing a memory device, the method comprising:

forming a memory stack in a recess of an insulative material by— depositing a selector layer in the recess;

depositing a memory cell layer over the selector layer; and etching the memory stack to define a plurality of memory elements;

forming a protective liner around individual ones of the memory elements; and removing a portion of the protective liner around the memory elements to expose a memory cell of each of the memory elements.

19. A method of manufacturing a memory device, the method comprising:

forming a memory stack in a recess of an insulative material by— depositing a selector layer in the recess;

depositing a memory cell layer over the selector layer; and etching the memory stack to define a plurality of memory elements;

depositing a dielectric material over the memory elements and an upper surface of the insulative material; and removing the dielectric material over the upper surface of the insulative material.

\* \* \* \* \*